(12) United States Patent
Campbell et al.

(10) Patent No.: US 7,349,213 B2
(45) Date of Patent: Mar. 25, 2008

(54) COOLANT CONTROL UNIT, AND COOLED ELECTRONICS SYSTEM AND METHOD EMPLOYING THE SAME

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 11/427,465

(22) Filed: Jun. 29, 2006

(65) Prior Publication Data

US 2008/0002364 A1 Jan. 3, 2008

(51) Int. Cl.
*H05K 7/20* (2006.01)

(52) U.S. Cl. ............ 361/699; 361/689; 361/700; 165/80.4; 165/80.5; 165/104.33; 62/259.2

(58) Field of Classification Search ............ 361/690, 361/689, 699, 700, 701, 715–721; 174/15.1, 174/15.2, 16.1; 257/713–715; 62/118, 119, 62/132, 171, 259.2, 434, 259.1, 267, 440, 62/441; 165/80.4, 80.5, 104.19–104.28, 165/104.33, 200, 208, 209, 157–168
See application file for complete search history.

(56) References Cited

U.S. PATENT DOCUMENTS

| | | | | |
|---|---|---|---|---|
| 4,729,424 A | * | 3/1988 | Mizuno et al. | 165/261 |
| 5,226,471 A | * | 7/1993 | Stefani | 165/200 |
| 5,535,818 A | | 7/1996 | Fujisaki et al. | 165/104.33 |
| 6,182,742 B1 | * | 2/2001 | Takahashi et al. | 165/104.33 |
| 6,305,180 B1 | * | 10/2001 | Miller et al. | 62/259.2 |
| 6,412,551 B1 | * | 7/2002 | Tustaniwskyj et al. | 165/264 |
| 6,628,520 B2 | | 9/2003 | Patel et al. | 361/696 |
| 6,711,017 B2 | * | 3/2004 | Kurokawa et al. | 361/699 |
| 6,714,412 B1 | * | 3/2004 | Chu et al. | 361/699 |
| 6,889,509 B1 | * | 5/2005 | Cader et al. | 62/118 |

(Continued)

FOREIGN PATENT DOCUMENTS

WO   WO 02/13588 A1   2/2002

*Primary Examiner*—Michael Datskovskiy
(74) *Attorney, Agent, or Firm*—Lily Neff, Esq.; Kevin P. Radigan, Esq.; Heslin Rothenberg Farley & Mesiti, P.C.

(57) ABSTRACT

A coolant control unit for a liquid cooled electronics system is provided, which includes an external coolant inlet and outlet for receiving and returning external coolant; an internal coolant loop for circulating coolant to the electronics system; a first and second control valve coupling the external coolant inlet and outlet to the internal coolant loop; a heat exchanger connected between the first and second control valves; and control logic for controlling operation of the coolant control unit in one of an external coolant mode and an internal coolant mode. In the external coolant mode, the first and second control valves allow passage of external coolant through the internal coolant loop to the electronics system, and in the internal coolant mode, the first and second control valves isolate coolant within the internal coolant loop from the external coolant inlet and outlet, and pass the coolant therein through the heat exchanger.

20 Claims, 5 Drawing Sheets

U.S. PATENT DOCUMENTS

| | | | |
|---|---|---|---|
| 7,216,695 B1 * | 5/2007 | Tilton et al. | 165/104.33 |
| 2005/0083657 A1 | 4/2005 | Hamman | 361/699 |
| 2005/0207116 A1 | 9/2005 | Yatskov et al. | 361/690 |

* cited by examiner

COOLANT CONTROL UNIT, AND COOLED ELECTRONICS SYSTEM AND METHOD EMPLOYING THE SAME

TECHNICAL FIELD

The present invention relates generally to heat transfer mechanisms, and more particularly, to cooled electronics systems and methods for removing heat generated by one or more electronic devices. Still more particularly, the present invention relates to a coolant control unit and method for a liquid cooled electronics system comprising one or more electronic devices, such as rack-mounted computer server units.

BACKGROUND OF THE INVENTION

As is well known, as circuit density of electronic devices increases in order to achieve faster and faster processing speeds, there is a corresponding increasing demand for the removal of heat generated by these devices. The increased heat load arises both because the devices are packaged more closely together and because the circuits themselves are operated at increasingly higher clock frequencies. Nonetheless, it is also known that thermal runaway conditions and excessive heat generated by circuits is the leading cause of failure of electronic devices. Furthermore, it is anticipated that the demand for heat removal from these devices will increase indefinitely.

Accordingly, there is a large and significant need to provide useful cooling mechanisms for electronic devices, individually and at all levels of packaging, including for example, rack-mounted or blade-mounted electronic devices of various large computer systems today.

SUMMARY OF THE INVENTION

Briefly summarized, provided herein in one aspect is a coolant control unit for a cooled electronics system. The coolant control unit includes: an external coolant inlet and external coolant outlet for receiving external coolant and returning external coolant, respectively; an internal coolant loop for circulating coolant between the coolant control unit and the cooled electronics system; a first control valve coupling the external coolant inlet to the internal coolant loop at a coolant supply location of the internal coolant loop and a second control valve coupling the external coolant outlet to the internal coolant loop at a coolant return location of the internal coolant loop; a liquid-to-air heat exchanger connected between the first control valve and the second control valve; and control logic for controlling operation of the coolant control unit in one of an external coolant mode and an internal coolant mode. In the external coolant mode, the first control valve and the second control valve are controlled to allow passage of external coolant through the internal coolant loop to the cooled electronics system, while in the internal coolant mode, the first control valve and the second control valve are controlled to isolate coolant within the internal coolant loop from the external coolant inlet and outlet and pass the coolant within the internal coolant loop through the liquid-to-air heat exchanger.

In another aspect, a cooled electronics system is provided. The cooled electronics system includes an electronics assembly comprising a support structure supporting at least one electronic device to be cooled, and a coolant control unit for facilitating liquid cooling of the at least one electronic device. The coolant control unit includes: an external coolant inlet and an external coolant outlet for receiving external coolant and returning external coolant, respectively; an internal coolant loop for circulating coolant to the at least one electronic device; a first control valve coupling the external coolant inlet to the internal coolant loop at a coolant supply location of the internal coolant loop and a second control valve coupling the external coolant outlet to the internal coolant loop at a coolant return location of the internal coolant loop; a liquid-to-air heat exchanger connected between the first control valve and the second control valve; and control logic for controlling operation of the coolant control unit in one of an external coolant mode and an internal coolant mode. In the external coolant mode, the first control valve and the second control valve are controlled to allow passage of external coolant through the internal coolant loop to the at least one electronic device, and in the internal coolant mode, the first control valve and the second control valve are controlled to isolate coolant within the internal coolant loop from the external coolant inlet and outlet, and to pass the coolant within the internal coolant loop through the liquid-to-air heat exchanger.

In a further aspect, a cooling control method is provided for a liquid cooled electronics system. The cooling control method includes employing a coolant control unit to control cooling of the liquid cooled electronics system in one of an external coolant mode and an internal coolant mode. The coolant control unit includes: an external coolant inlet and an external coolant outlet for receiving external coolant and returning external coolant, respectively; an internal coolant loop for circulating coolant to the liquid cooled electronics system; a first control valve coupling the external coolant inlet to the internal coolant loop at a coolant supply location of the internal coolant loop and a second control valve coupling the external coolant outlet to the internal coolant loop at a coolant return location of the internal coolant loop; and a liquid-to-air heat exchanger connected between the first control valve and the second control valve. The employing includes operating the coolant control unit in one of the external coolant mode and the internal coolant mode. The operating includes controlling the first control valve and the second control valve to allow passage of external coolant through the internal coolant loop to the liquid cooled electronics system when in the external coolant mode, and controlling the first control valve and the second control valve to isolate coolant within the internal coolant loop from the external coolant inlet and outlet, and to circulate coolant within the internal coolant loop through the liquid-to-air heat exchanger when in the internal coolant mode.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
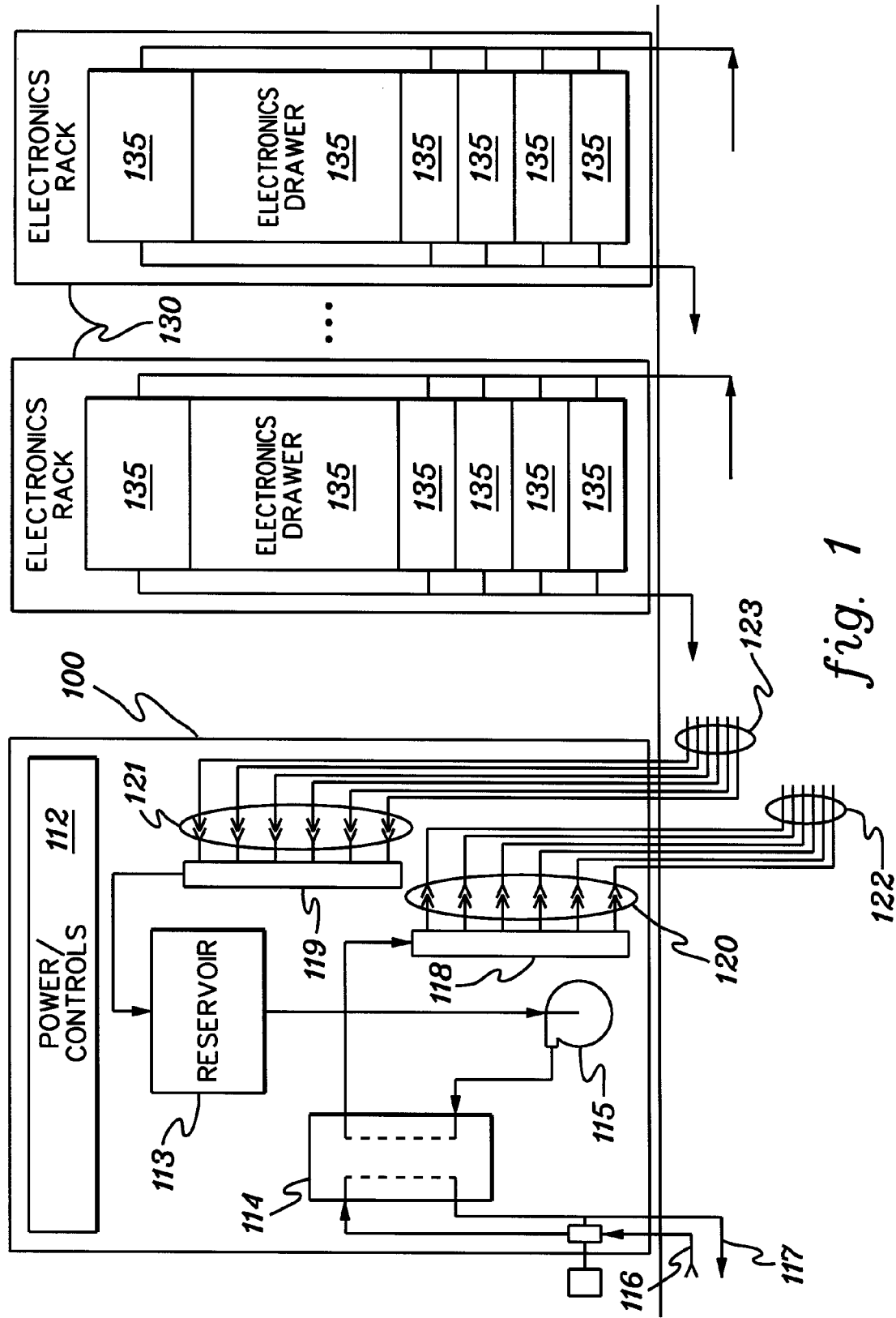
FIG. 1 depicts a conventional coolant distribution unit, such as a computer room water conditioning unit (CRWCU), for cooling one or more electronics racks of a computing environment.

As used herein, "electronics system" comprises one or more heat generating components of a computer system or other electronics system requiring cooling. By way of example, an electronics system may comprise a mainframe server in one implementation. The term "electronics rack" includes any housing, frame, rack, blade server system, etc., having a heat generating component of a computer system or electronics system, and may be, for example, a stand alone computer processor having high, mid or low end processing capability. In one embodiment, an electronics rack may comprise multiple electronics drawers, each comprising an electronics system with one or more heat generating components requiring cooling. Each heat generating component may comprise an electronics device, such as an electronics component, an integrated circuit chip, a single-chip electronics module, a multi-chip electronics module, etc.

One example of coolant within a cooling system in accordance with an aspect of the present invention is water. However, the concepts disclosed herein are readily adapted to use with other types of coolant on the facility side, system side, and internal coolant loop side of the cooling system. For example, one or more of the coolants may comprise a brine, a fluorocarbon liquid, a liquid metal, or other similar coolant, or a refrigerant, while still maintaining the advantages and unique features of the present invention.

The aggregate heat load of (for example) microprocessor heat rejection, aggravated by the often high heat flux nature of such a thermal load, can represent a significant heat transfer challenge at the system level. For high performance mainframe computer systems, it is necessary to maintain a low microprocessor device side temperature to control leakage and ensure reliability. Up to 2 kW of heat may need to be removed, while maintaining a low microprocessor temperature (e.g., as low as 50° C.).

One solution to this heat transfer challenge is to use a closed-loop vapor compression refrigeration system, which ultimately rejects heat to the air within a computer room. Due to the inherent inefficiencies of a vapor compression refrigeration system, however, a significant load is generated by the refrigeration system itself, causing an even greater strain on the computer room facility.

Another heat transfer solution is to use liquid cooled cold plates on the microprocessors and reject the heat into a facility's chilled water supply. However, facility water typically available at customer locations (e.g., data centers) is not typically suitable for use in a cold plate. First, condensation formation is a concern as the temperature of the data center water, ranging from 7° C. to 15° C., is far below the room dew point (typically 18-23° C.). Second, the relatively poor quality of the facility water (in chemistry, cleanliness, etc.) impacts system reliability. It is therefore desirable to utilize a water cooling/conditioning unit that circulates higher quality water to/from the electronics system(s) and rejects the heat to the data center water. As used herein, "facility water" or "facility coolant" refers to, in one example, this data center water or coolant, while "system coolant" refers to cooled/conditioned coolant circulating between a coolant distribution unit and the electronics system(s) to be cooled. Depending upon the implementation, "external coolant" refers to either system coolant, e.g., assuming the presence of a cooling distribution unit, or to facility coolant in the absence of a coolant distribution unit.

The above-described liquid coolant heat transfer solution, although beneficial, requires that the customer have a facility chilled water supply available and operational at all times, which is not true for all computer room installations. Thus, a need remains for a modular coolant control unit such as presented herein that is able to alternatively, intelligently employ different heat transfer approaches to cooling an electronics system.

Reference is now made to the drawings, wherein the same reference numbers used throughout different figures designate the same or similar components. FIG. 1 depicts one embodiment of a coolant distribution unit 100 for a computer room. The coolant distribution unit is conventionally a relatively large unit which occupies what would now be considered a full electronics frame. Within coolant distribution unit 100 is a power/control element 112, a reservoir/expansion tank 113, a heat exchanger 114, a pump 115 (often accompanied by a redundant second pump), facility water (or site or customer service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121. Each electronics rack includes (in one example) multiple electronics drawers 135 comprising multiple electronics systems.

Figure 2:
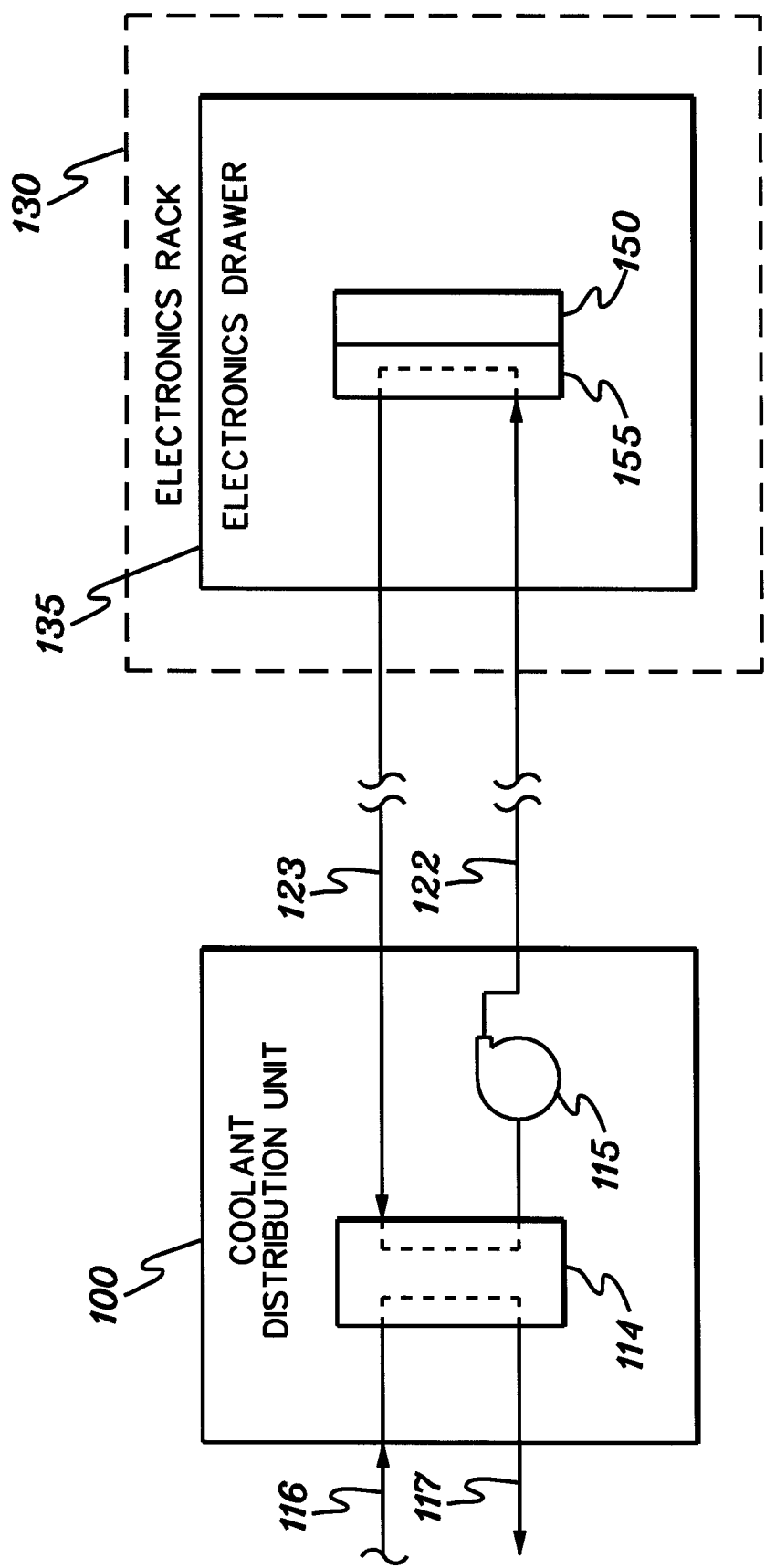
FIG. 2 is a schematic of one embodiment of an electronics drawer of an electronics rack and the cooling system therefore employing a coolant distribution unit with a facility coolant loop and a system coolant loop, which may include one or more cooling apparatuses, in accordance with an aspect of the present invention.

FIG. 2 schematically illustrates operation of the cooling system of FIG. 1, wherein a liquid cooled cold plate 155 is shown (by way of example) coupled to an electronics device 150 of electronics drawer 135 within electronics rack 130. Heat is removed from electronics device 150 via the system coolant, which is pumped via pump 115 through cold plate 155 within the system coolant loop defined by heat exchanger 114 of coolant distribution unit 100, lines 122, 123 and cold plate 155. The system coolant loop and coolant distribution unit are designed to provide coolant of a controlled temperature and pressure, as well as controlled chemistry and cleanliness to the electronics. Furthermore, the system coolant is physically separate from the less controlled facility coolant in lines 116, 117 to which heat is ultimately transferred.

Although the cooling system of FIGS. 1 & 2 advantageously maintains electronic device operating temperature at a low level, the implementation requires the existence of an external coolant to the electronics rack to be cooled; that is, facility coolant and system coolant must be available within the computer room installation to implement the cooling system. This is a limitation since certain computer room installations do not have chilled facility coolant available, for either direct application to the electronics system or indirect application via a coolant distribution unit such as depicted in FIGS. 1 & 2. Further, if the external coolant applied to the electronics rack fails, for example, due to a coolant line break, then the electronics systems being cooled will fail. Thus, disclosed hereinbelow is a coolant control unit for an electronics housing, such as an electronics rack having one or more electronics systems with one or more devices to be cooled, which can operate in either an external coolant mode or an internal coolant mode.

Generally stated, the coolant control unit presented herein is for a liquid cooled electronics system, and includes: an external coolant inlet and external coolant outlet for receiving external coolant at the coolant control unit and returning external coolant from the coolant control unit; an internal coolant loop for circulating coolant between the coolant control unit and the cooled electronics system; a first electronically controlled three-way valve coupling the external coolant inlet to the internal coolant loop at a coolant supply location of the internal coolant loop and a second electronically controlled three-way valve coupling the external coolant outlet to the internal coolant loop at a coolant return location of the internal coolant loop; a liquid-to-air heat exchanger and a coolant pump connected in fluid communication between the first control valve and the second control valve; an electronically controlled air-moving device for moving air across the liquid-to-air heat exchanger; and control logic for controlling operation of the coolant control unit in one of an external coolant mode and an internal coolant mode. In the external coolant mode, the first control valve and the second control valve are actuated to allow passage of external coolant through the internal coolant loop to the cooled electronics system, and in the internal coolant mode, the first control valve and the second control valve are actuated to isolate coolant within the internal coolant loop from the external coolant (i.e., to define a closed internal coolant loop) and to circulate liquid coolant therein through the liquid-to-air heat exchanger and the coolant pump, as well as initiate operation of the air-moving device. The cooled electronics system can comprise any heat generating electronics component or device, which is to be cooled by liquid coolant, either directly by application of the liquid coolant to a surface to be cooled, or indirectly, for example, through a cold plate such as depicted in the example of FIG. 2.

Advantageously, when in the external coolant mode, external coolant received at the coolant control unit, for example, from a coolant distribution unit or other conditioned water supply, is controllably passed through the coolant control unit via the first control valve to the internal coolant loop for forwarding to the electronics system to be cooled. If external coolant is unavailable, then the coolant control unit operates in the internal coolant mode, with existing coolant within the internal coolant loop being circulated by the coolant pump through the internal coolant loop and the liquid-to-air heat exchanger. An air moving device, such as an electronically adjustable fan unit, is positioned to generate air flow across the liquid-to-air heat exchanger when in the closed loop, internal coolant mode. The fan unit and liquid-to-air heat exchanger are positioned away from any air flow path across the electronics system to be cooled, with heated air produced thereby being exhausted into the computer room. In particular, as the heated coolant circulating through the internal coolant loop passes through the liquid-to-air heat exchanger, heat within the coolant is rejected to the air via the heat exchanger providing a high efficiency cooling, but a lower cooling performance compared to, for example, a refrigeration system. When in the external coolant mode, the liquid-to-air heat exchanger and coolant pump are bypassed by appropriately actuating the first and second control valves. As explained further below, the control logic of the coolant control unit advantageously automatically initiates operation in one of the external coolant mode and the internal coolant mode, and if in the external coolant mode, the control logic can sense a failure of the external coolant system and automatically switch to the internal coolant mode, thus ensuring continued operation of the one or more electronics systems being cooled, notwithstanding failure of the external coolant system.

Figure 3:
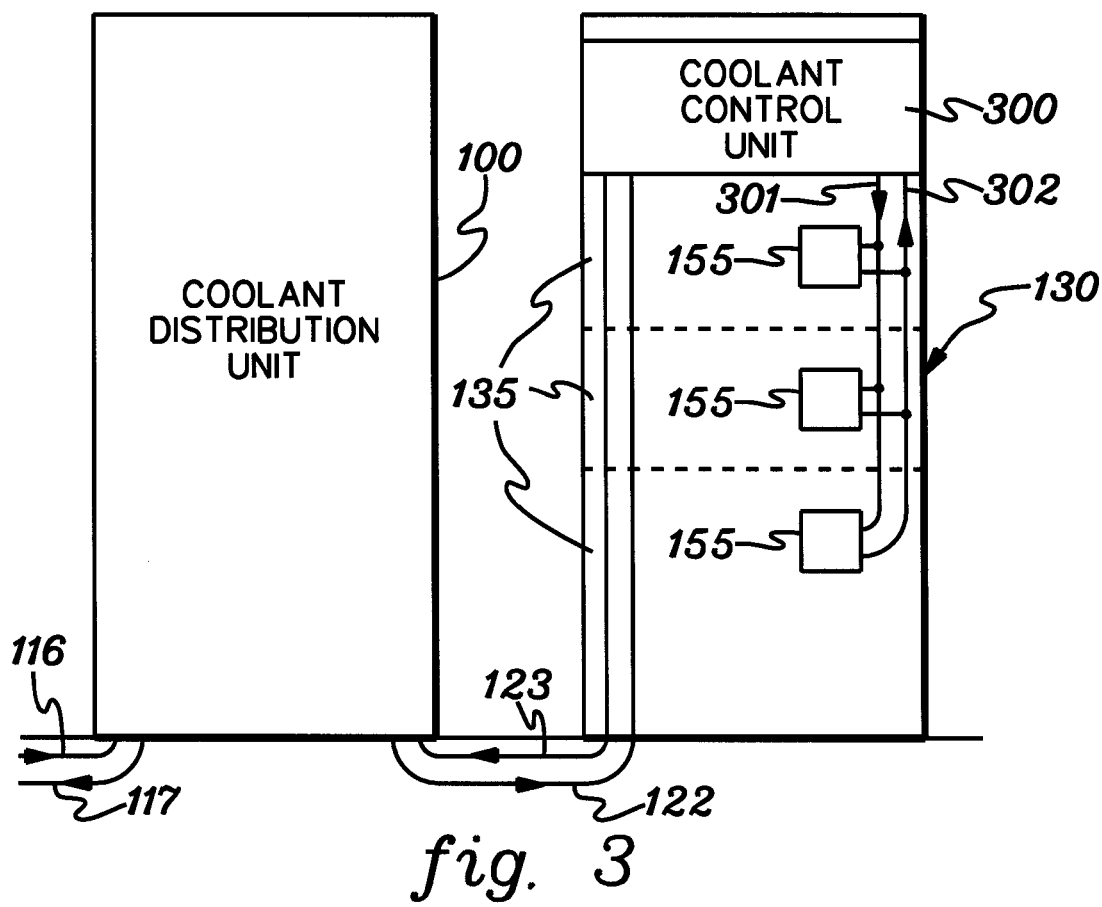
FIG. 3 is a schematic of one embodiment of a coolant distribution unit and an electronics frame employing a coolant control unit, in accordance with an aspect of the present invention.

FIG. 3 depicts one embodiment of an electronics rack 130 comprising multiple liquid cooled electronics systems which employ a coolant control unit 300, in accordance with an aspect of the present invention. This cooled electronics rack receives coolant from a coolant distribution unit 100 of, for example, a computer room. More particularly, facility coolant passes through coolant distribution unit 100 via inlet 116 and outlet 117. Conditioned coolant (which in this example is the external coolant to the coolant control unit) is fed from coolant distribution unit 100 to coolant control unit 300 (disposed within electronics rack 130), via conditioned coolant supply line 122 and conditioned coolant return line 123. In this example, coolant control unit 300 includes an internal coolant loop, comprising coolant supply line 301 and coolant return line 302, which provides fluid communication between coolant control unit 300 and multiple, parallel coupled cold plates 155 disposed within multiple electronics drawers 135 of electronics rack 130. Again, cold plates 155 are provided by way of example only. Direct coolant impingement onto the surfaces to be cooled of the electronics systems could alternately be employed, as will be understood by those skilled in the art.

As will be explained further below, coolant control unit 300 is in one embodiment a modular unit replicated throughout multiple electronics racks employing liquid cooling. Additionally, each electronics rack could include a redundant coolant control unit (not shown), with appropriate external coolant inlet and outlet couplings and internal coolant loop couplings, to provide redundancy to the coolant control functions described herein. Advantageously, redundancy allows for field replacement or repair of one modular coolant control unit without affecting operation of the electronics systems being cooled. Further, although illustrated in an upper portion of the electronics rack in the embodiment of FIG. 3, those skilled in the art will understand that the coolant control unit could be disposed at any position within the electronics rack, or even external to the electronics rack if desired.

Figure 4:
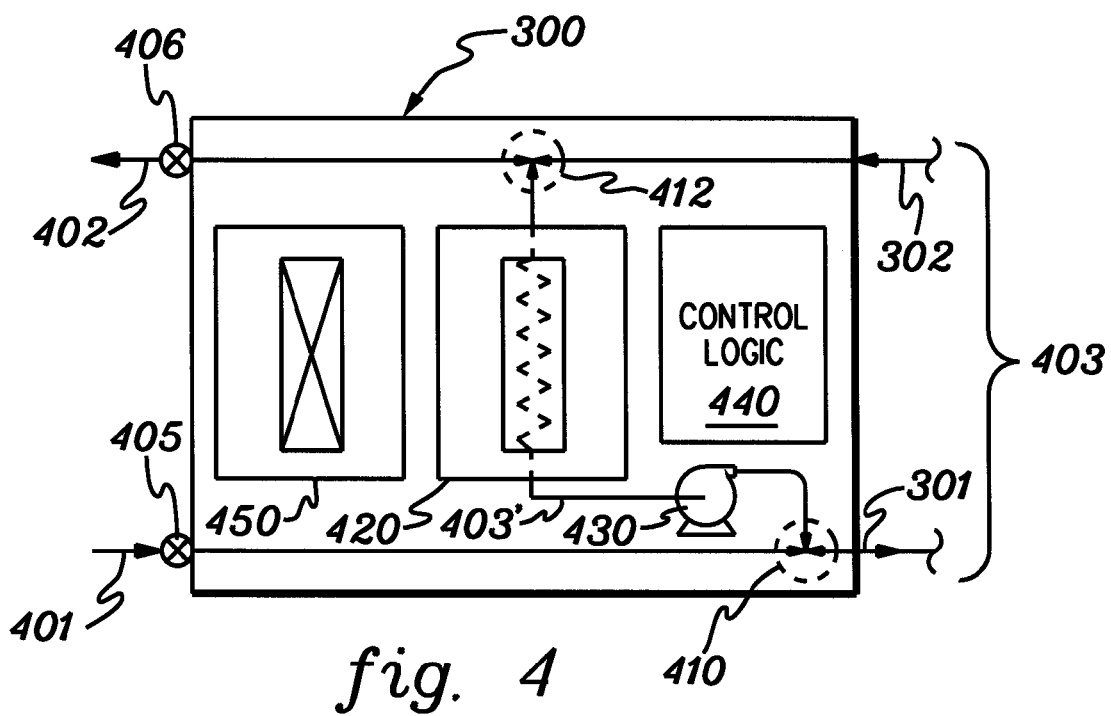
FIG. 4 is a plan view of one embodiment of a coolant control unit, in accordance with an aspect of the present invention.

FIG. 4 depicts one embodiment of coolant control unit 300, in accordance with an aspect of the present invention. As shown, an external coolant inlet 401 resides at a first quick connect/disconnect coupling 405, while an external coolant outlet 402 resides at a second quick connect/disconnect coupling 406. Quick connect/disconnect couplings 405, 406 may comprise various types of commercially available quick connect/disconnect couplings such as those available from Colder Products Company of St. Paul, Minn., USA, or Parker Hannifin of Cleveland, Ohio, USA. Couplings 405, 406 are in fluid communication with a first control valve 410 and a second control valve 412, respectively. Control valves 410, 412 are, in one embodiment, each an electronically controlled three-way valve actuated by control logic 440 of coolant control unit 300. First control valve 410 is disposed at a coolant supply location of the internal coolant loop, and couples external coolant inlet 401 to coolant supply line 301 of the internal coolant loop in the external coolant mode. Second control valve 412 is disposed at a coolant return location of the internal coolant loop and couples coolant return line 302 of the internal coolant loop to external coolant outlet 402 in the external control mode. Thus, in the external control mode, control valves 410 & 412 are operated by control logic 440 to pass through at least a portion of the external coolant directly into the internal coolant loop. Further, as discussed below, control valves 410 & 412 can be employed by control logic 440 to control the amount of external coolant flow into the internal coolant loop.

As shown in FIG. 4, coolant control unit 300 further includes a bypass line 403' coupled between first control valve 410 and second control valve 412. This bypass line 403', which is part of the internal coolant loop 403 when in the internal coolant mode, includes a liquid-to-air heat exchanger 420 and a coolant pump 430 connected in fluid communication between the valves. Coolant pump 430 circulates coolant through the internal coolant loop when in internal coolant mode. An air-moving device 450, such as an electronically controlled fan unit, is positioned to move air across the liquid-to-air heat exchanger 420 when in the internal coolant mode. Although not shown, control logic 440 is electrically connected to first control valve 410, second control valve 412, coolant pump 430 and air-moving device 450 to adjustably control the electronically activated valves 410, 412, as well as coolant pump 430 and air-moving device 450, dependant upon the particular mode of operation and coolant condition. As noted above, the internal coolant mode is advantageously automatically entered by the coolant control unit should, for example, external coolant to the coolant control unit be unavailable in a particular installation or should the external coolant system fail.

Figure 5:
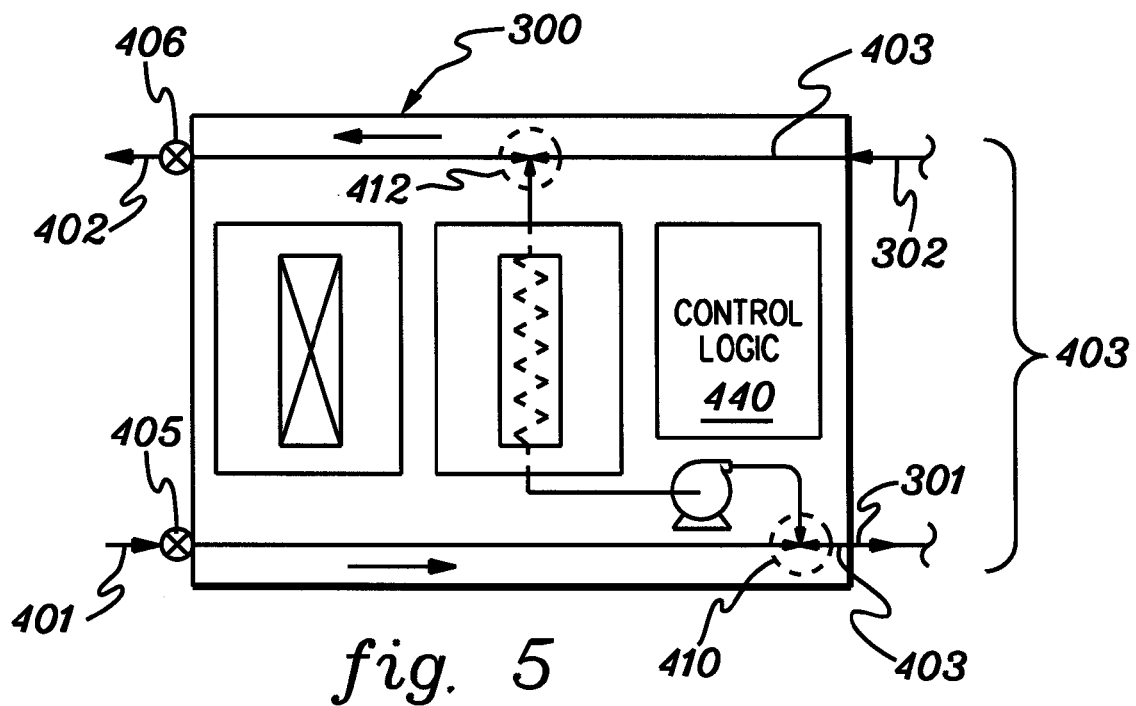
FIG. 5 is a plan view of the coolant control unit of FIG. 4, showing the unit in external coolant mode, in accordance with an aspect of the present invention.

FIG. 5 depicts coolant control unit 300 of FIG. 4 in external coolant mode. In external coolant mode, the cooled electronics systems of (for example) an electronics rack employing the unit may realize enhanced performance due to an increased capability to shed excess heat, resulting in higher power and higher frequency operation. The external coolant mode can be initiated by control logic 440 sensing connectivity of conditioned coolant supply line 122 (FIG. 3) to external coolant input 401 at quick connect/disconnect coupling 405, and connectivity of conditioned coolant return line 123 (FIG. 3) to external coolant outlet 402 at quick connect/disconnect coupling 406. External coolant mode is entered by control logic 440 electronically positioning first control valve 410 and second control valve 412 to pass at least a portion of the external coolant directly into internal coolant loop 403, with external coolant being fed through internal coolant supply line 301 and returned through internal coolant return line 302. As noted, in this mode the coolant control unit essentially functions as a flow control pass through of the external coolant.

Figure 6:
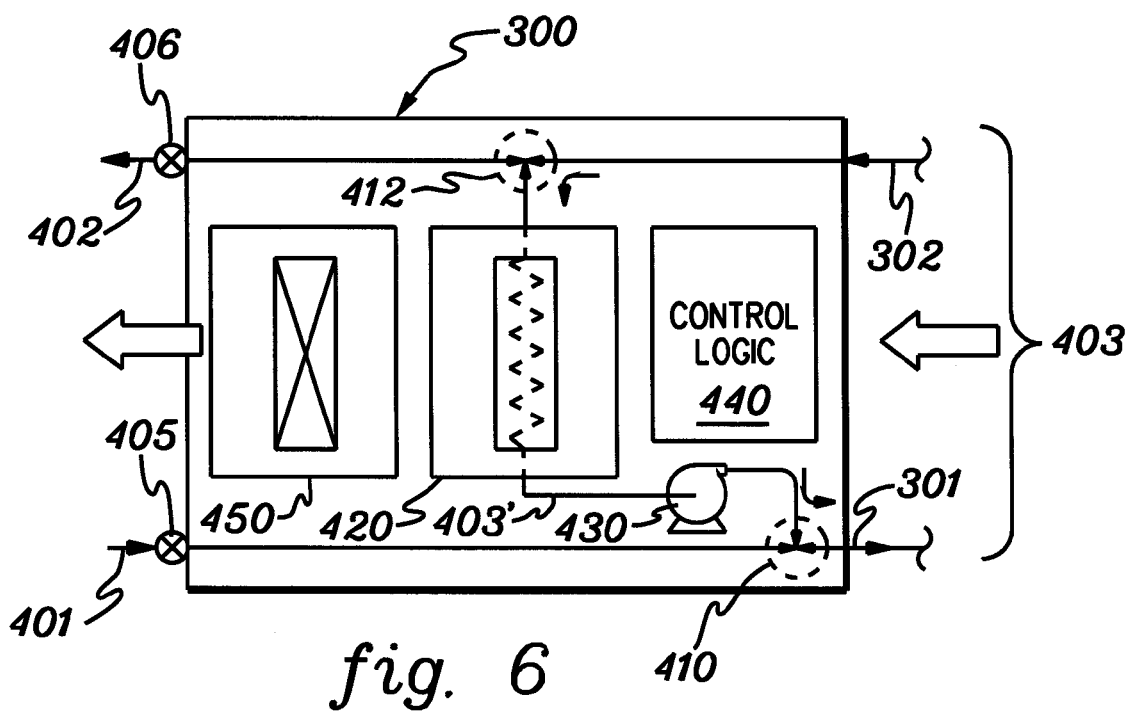
FIG. 6 is a plan view of the coolant control unit of FIGS. 4 & 5, showing the coolant control unit in internal coolant mode, in accordance with an aspect of the present invention.

FIG. 6 depicts coolant control unit 300 in internal coolant mode. As noted, should external coolant be unavailable, or should control logic 440 detect an external coolant system failure (for example, by a rise in external coolant temperature passing through the coolant control unit), control logic 440 initiates the internal coolant mode by electronically positioning first control valve 410 and second control valve 412 to shunt coolant of the internal coolant loop 403 through bypass line 403', comprising liquid-to-air heat exchanger 420 and coolant pump 430. Along with switching control valves 410, 412, control logic 440 activates operation of coolant pump 430 and air-moving device 450, to facilitate heat transfer from coolant within the internal coolant loop to the ambient air via the liquid-to-air heat exchanger.

Advantageously, the internal coolant mode can be employed in customer installations lacking facility chilled water, or a coolant conditioning unit, or when an existing external coolant source fails. In either case, the control logic of the coolant control unit automatically senses the appropriate operational mode, i.e., either internal coolant mode or external coolant mode, and activates the control valves, the air-moving device and the coolant pump accordingly. In the internal coolant mode, computer room cooled air is drawn through the coolant control unit, and in particular, the liquid-to-air heat exchanger to transfer heat from the coolant passing through the internal coolant loop to the computer room environment, while in the external coolant mode, external coolant is passed through the coolant control unit to the internal coolant loop for direct or indirect cooling of the electronics systems.

Figure 7:
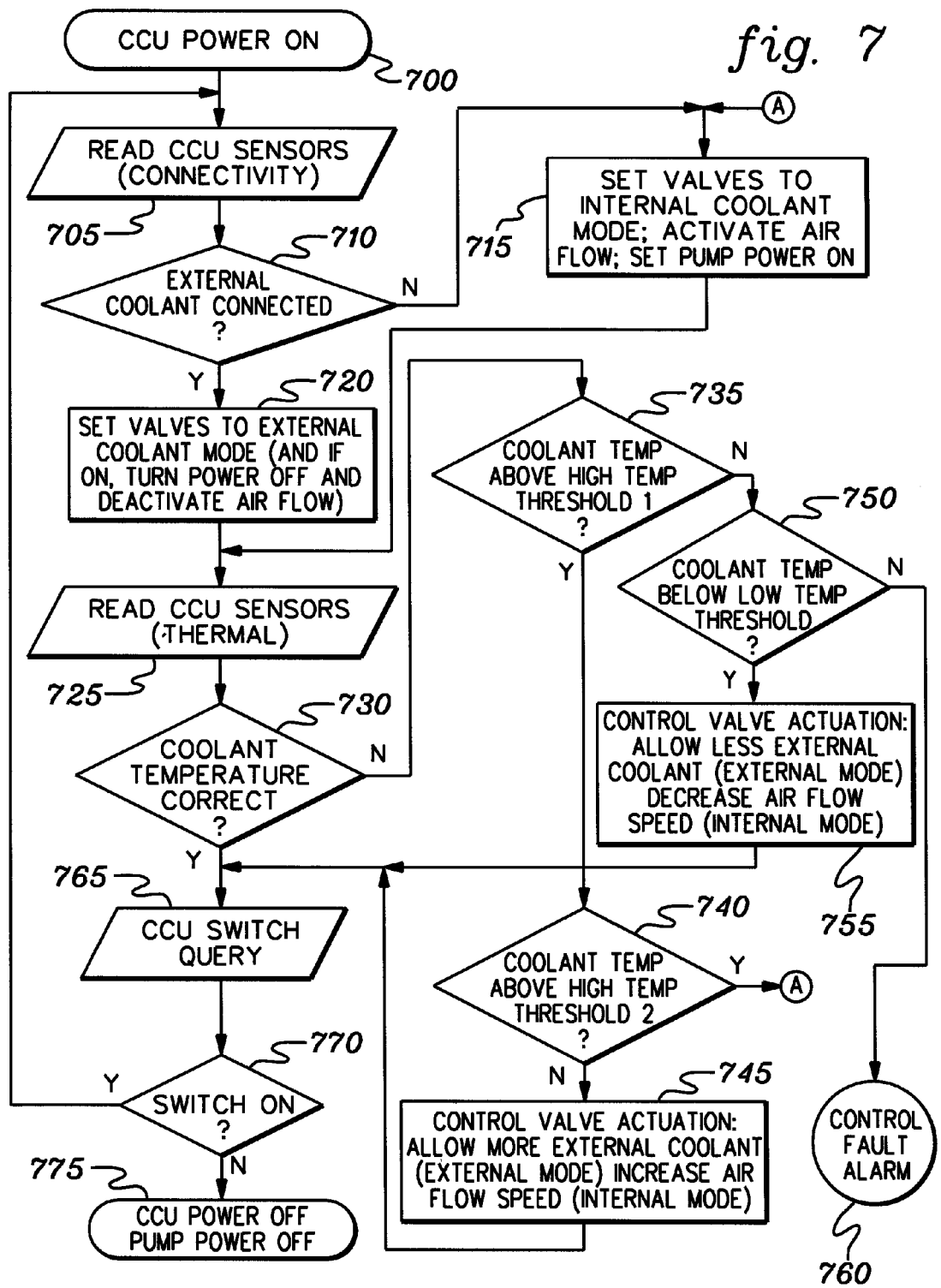
FIG. 7 is a flowchart of one embodiment of coolant control logic for a coolant control unit, in accordance with an aspect of the present invention.

By way of further example, FIG. 7 is a flowchart of one embodiment of processing implemented by the control logic of the coolant control unit, in accordance with an aspect of the present invention. Upon power on of the coolant control unit 700, the logic reads external coolant unit connectivity sensors 705 to determine, for example, whether the external coolant inlet and outlet are interfaced to conditioned coolant supply and return lines, respectively, via the quick connect/disconnect couplings. By way of example, the connectivity sensors could comprise physical contact switches or electrical continuity switches. From the readings of the connectivity sensors, the logic determines whether external coolant is connected to the coolant control unit 710. If "no", then the control valves are set to internal coolant mode, and the air-moving device is activated to move air across the liquid-to-air heat exchanger and the coolant pump is turned on 715. Assuming that external coolant is available, then the control logic activates the control valves in external coolant mode (and if on, turns the pump power off and deactivates air flow across the liquid-to-air heat exchanger) 720.

After the mode has been set, the logic employs coolant thermal sensors 725 to monitor coolant temperature within the internal coolant loop (e.g., within the coolant supply line 301 (see FIGS. 3 & 4)). The logic determines whether the coolant temperature is acceptable 730, and if not, determines whether the coolant temperature is above a first upper temperature threshold 735. If so, then the logic determines whether the coolant temperature is above a second, higher upper temperature threshold 740. If not, then the control valves are activated to allow more external coolant to pass through the internal coolant loop (in the external coolant mode), or the air flow speed across the liquid-to-air heat exchanger is increased (in the internal coolant mode) 745. If the coolant temperature is above the higher, second upper threshold, then the control logic automatically switches from external coolant mode to internal coolant mode (A) 715, that is, assuming that the mode of operation was the external coolant mode. If the coolant temperature is lower than the first upper temperature limit, then processing determines whether the coolant temperature is below a lower temperature threshold 750. If so, then the control valves are activated to allow less external coolant (in the external coolant mode), or to decrease the air flow speed across the liquid-to-air heat exchanger (in the internal coolant mode). If the coolant temperature is not below the lower temperature threshold, then a control fault alarm is set 760, indicating a control logic malfunction.

Once the control valves have been appropriately adjusted (for example, by some preset increment), then the logic determines whether a coolant control unit power off switch has been activated 765. If the switch is still "on" 770, then the logic returns to check the coolant control unit connectivity sensors 705. Otherwise, the coolant control unit is powered off, along with the coolant pump 775.

The logic capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A coolant control unit for a liquid cooled electronics system comprising:
   an external coolant inlet and external coolant outlet for receiving external coolant and returning external coolant, respectively;
   an internal coolant loop for circulating coolant to the liquid cooled electronics system;
   a first control valve coupling the external coolant inlet to the internal coolant loop at a coolant supply location of the internal coolant loop and a second control valve coupling the external coolant outlet to the internal coolant loop at a coolant return location of the internal coolant loop;
   a liquid-to-air heat exchanger connected between the first control valve and the second control valve; and
   control logic for controlling operation of the coolant control unit in one of an external coolant mode and an internal coolant mode, wherein in the external coolant mode, the first control valve and the second control valve are controlled to allow passage of external coolant through the internal coolant loop to the liquid cooled electronics system, and in the internal coolant mode, the first control valve and second control valve are controlled to isolate coolant within the internal coolant loop from the external coolant inlet and outlet, and pass the coolant therein through the liquid-to-air heat exchanger.

2. The coolant control unit of claim 1, further comprising sensors at the external coolant inlet and the external coolant outlet for sensing availability of external coolant flow, and wherein the control logic further comprises logic for automatically initiating operation of the coolant control unit in one of the external coolant mode and the internal coolant mode based in part on sensed availability of external coolant flow.

3. The coolant control unit of claim 1, wherein the first control valve and the second control valve each comprises an electronically controlled three-way valve controlled by the control logic, and wherein the control logic further comprises flow control logic for adjusting at least one of the electronically controlled three-way valves to control an amount of external coolant flow through the internal coolant loop when in the external coolant mode, the flow control logic being responsive to a sensed coolant temperature within the internal coolant loop.

4. The coolant control unit of claim 3, wherein the flow control logic further comprises logic for increasing external coolant flow through the internal coolant loop when sensed coolant temperature is above a first upper temperature threshold, and logic for decreasing external coolant flow through the internal coolant loop when sensed coolant temperature is below a lower temperature threshold.

5. The coolant control unit of claim 4, wherein the control logic further comprises logic for automatically switching from the external coolant mode to the internal coolant mode when sensed coolant temperature of the internal coolant loop is above a second upper temperature threshold indicative of an external coolant failure, wherein the second upper temperature threshold is a higher temperature than the first upper temperature threshold.

6. The coolant control unit of claim 1, further comprising an air-moving device for generating air flow across the liquid-to-air heat exchanger when in the internal coolant mode and a coolant pump connected in fluid communication with the liquid-to-air heat exchanger between the first control valve and the second control valve, the air-moving device being electronically controlled by the control logic, and wherein the control logic further comprises logic for automatically switching from the external coolant mode to the internal coolant mode upon sensing an external coolant failure, the automatically switching comprising automatically transitioning the first and second control valves to the internal coolant mode, and automatically initiating operation of the coolant pump and the air-moving device.

7. The coolant control unit of claim 1, further comprising an air-moving device for generating air flow across the liquid-to-air heat exchanger when in the internal coolant mode, the air-moving device being electronically controlled by the control logic, and wherein the control logic further comprises logic for sensing coolant temperature within the internal coolant loop, and for automatically adjusting speed of the air-moving device in the internal coolant mode dependent on the sensed coolant temperature.

8. A cooled electronics system comprising:
   an electronics assembly including a support structure supporting at least one electronic device to be cooled; and
   a coolant control unit for facilitating liquid cooling of the at least one electronic device, the coolant control unit comprising:
      an external coolant inlet and external coolant outlet for receiving external coolant and returning external coolant, respectively;

an internal coolant loop for circulating coolant to the at least one electronic device;

a first control valve coupling the external coolant inlet to the internal coolant loop at a coolant supply location of the internal coolant loop and a second control valve coupling the external coolant outlet to the internal coolant loop at a coolant return location of the internal coolant loop;

a liquid-to-air heat exchanger connected between the first control valve and the second control valve; and control logic for controlling operation of the coolant control unit in one of an external coolant mode and an internal coolant mode, wherein in the external coolant mode, the first control valve and the second control valve are controlled to allow passage of external coolant through the internal coolant loop to the at least one electronic device, and in the internal coolant mode, the first control valve and second control valve are controlled to isolate coolant within the internal coolant loop from the external coolant inlet and outlet, and pass the coolant therein through the liquid-to-air heat exchanger.

9. The cooled electronics system of claim 8, wherein the support structure of the electronics assembly comprises an electronics rack, and the electronics assembly further comprises multiple electronic devices to be cooled, and wherein the internal coolant loop circulates coolant within the electronics assembly to cool the multiple electronic devices, and the coolant control unit is coupled to the support structure of the electronics assembly.

10. The cooled electronics system of claim 8, further comprising sensors at the external coolant inlet and the external coolant outlet for sensing availability of external coolant flow, and wherein the control logic further comprises logic for automatically initiating operation of the coolant control unit in one of the external coolant mode and the internal coolant mode based in part on sensed availability of external coolant flow.

11. The cooled electronics system of claim 8, wherein the first control valve and the second control valve each comprises an electronically controlled three-way valve controlled by the control logic, and wherein the control logic further comprises flow control logic for adjusting at least one of the electronically controlled three-way valve to control an amount of external coolant flow through the internal coolant loop when in the external coolant mode, the flow control logic being responsive to a sensed coolant temperature of the internal coolant loop.

12. The cooled electronics system of claim 11, wherein the flow control logic further comprises logic for increasing external coolant flow through the internal coolant loop when the sensed coolant temperature is above a first upper temperature threshold, and logic for decreasing external coolant flow through the internal coolant loop when sensed coolant temperature is below a lower temperature threshold.

13. The cooled electronics system of claim 12, wherein the control logic further comprises logic for automatically switching from the external coolant mode to the internal coolant mode when sensed coolant temperature of the internal coolant loop is above a second upper temperature threshold indicative of an external coolant failure, wherein the second upper temperature threshold is a higher temperature than the first upper temperature threshold.

14. The cooled electronics system of claim 8, further comprising an air-moving device for generating air flow across the liquid-to-air heat exchanger when in the internal coolant mode and a coolant pump connected in fluid communication with the liquid-to-air heat exchanger between the first control valve and the second control valve, the air-moving device being electronically controlled by the control logic, and wherein the control logic further comprises logic for automatically switching from the external coolant mode to the internal coolant mode upon sensing an external coolant failure, the automatically switching comprising automatically transitioning the first and second control valves to the internal control mode, and automatically initiating operation of the coolant pump and the air-moving device.

15. The cooled electronics system of claim 8, further comprising an air-moving device for generating air flow across the liquid-to-air heat exchanger when in the internal coolant mode, the air-moving device being electronically controlled by the control logic, and wherein the control logic further comprises logic for sensing coolant temperature within the internal coolant loop, and for automatically adjusting speed of the air-moving device in the internal coolant mode dependent on the sensed coolant temperature.

16. A cooling control method for a liquid cooled electronics system, comprising:

employing a coolant control unit to control cooling of the liquid cooled electronics system in one of an external coolant mode and an internal coolant mode, the coolant control unit comprising:

an external coolant inlet and external coolant outlet for receiving external coolant and returning external coolant, respectively;

an internal coolant loop for circulating coolant to the liquid cooled electronics system;

a first control valve coupling the external coolant inlet to the internal coolant loop at a coolant supply location of the internal coolant loop and a second control valve coupling the external coolant outlet to the internal coolant loop at a coolant return location of the internal coolant loop;

a liquid-to-air heat exchanger connected between the first control valve and the second control valve; and wherein the employing comprises operating the coolant control unit in one of the external coolant mode and the internal coolant mode, the operating comprising controlling the first control valve and the second control valve to allow passage of external coolant through the internal coolant loop to the liquid cooled electronics system when in the external coolant mode, and controlling the first control valve and the second control valve to isolate coolant within the internal coolant loop from the external coolant inlet and outlet, and to circulate coolant therein through the liquid-to-air heat exchanger when in the internal coolant mode.

17. The cooling control method of claim 16, wherein the employing further comprises sensing for external coolant availability and automatically initiating operation of the coolant control unit in one of the external coolant mode and the internal coolant mode based on sensed availability of the external coolant.

18. The cooling control method of claim 16, wherein the employing further comprises monitoring coolant temperature within the internal coolant loop and automatically adjusting external coolant flow through the internal coolant loop when in the external coolant mode to maintain coolant temperature of the internal coolant loop within a predefined range.

19. The cooling control method of claim 16, wherein the employing further comprises automatically switching from the external coolant mode to the internal coolant mode upon sensing an external coolant failure, the automatically switching including automatically transitioning the first and second control valves to the internal coolant mode, and initiating coolant flow through the internal coolant loop and air flow across the liquid-to-air heat exchanger.

20. The cooling control method of claim 16, wherein the coolant control unit further includes an air-moving device, and wherein the employing further comprises sensing coolant temperature within the internal coolant loop and automatically adjusting speed of the air-moving device when in the internal coolant mode dependent upon sensed coolant temperature of the internal coolant loop.

* * * * *